United States Patent
Kim et al.

(10) Patent No.: US 9,923,021 B2
(45) Date of Patent: Mar. 20, 2018

(54) IMAGE SENSOR

(71) Applicants: Rayence Co., Ltd., Gyeonggi-do (KR); VATECH EWOO Holdings Co., Ltd., Gyeonggi-do (KR)

(72) Inventors: Ki Hyung Kim, Gyeonggi-do (KR); Tae Woo Kim, Gyeonggi-do (KR); Dong Jin Lee, Gyeonggi-do (KR)

(73) Assignees: Rayence Co., Ltd., Gyeonggi-do (KR); VATECH EWOO Holdings Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/400,953

(22) Filed: Jan. 6, 2017

(65) Prior Publication Data
US 2017/0194376 A1    Jul. 6, 2017

(30) Foreign Application Priority Data

Jan. 6, 2016 (KR) .................. 10-2016-0001775

(51) Int. Cl.
*H01L 27/00* (2006.01)
*H01L 27/146* (2006.01)
*H01L 31/0224* (2006.01)
*H01L 29/47* (2006.01)

(52) U.S. Cl.
CPC .. *H01L 27/14685* (2013.01); *H01L 27/14603* (2013.01); *H01L 27/14609* (2013.01); *H01L 27/14676* (2013.01); *H01L 31/0224* (2013.01); *H01L 29/47* (2013.01)

(58) Field of Classification Search
None
See application file for complete search history.

(56) References Cited

U.S. PATENT DOCUMENTS 4,740,824 A * 4/1988 Yano .................. H01L 27/14665
                                                           250/208.1

OTHER PUBLICATIONS

"Area, n." OED Online. Oxford University Press, Mar. 2017. Web. Jun. 9, 2017.*

* cited by examiner

*Primary Examiner* — Reema Patel
(74) *Attorney, Agent, or Firm* — IP Legal Services, LLC

(57) ABSTRACT

There is provided an image sensor including: a plurality of first electrodes respectively formed within a plurality of pixel areas, the pixel areas being formed on a substrate; a protection layer formed on an upper surface of the substrate and including a plurality of contact holes respectively exposing the first electrodes of the pixel areas; a plurality of auxiliary electrodes respectively contacting with the first electrodes through the contact holes and extending to an upper surface of the protection layer of the pixel area; a photoconductive layer formed on both the first electrodes and on the auxiliary electrodes; and a second electrode formed on the photo conductive layer.

3 Claims, 3 Drawing Sheets

IMAGE SENSOR

CROSS REFERENCE TO RELATED APPLICATION

The present application claims priority to Korean Patent Application No. 10-2016-0001775, filed Jan. 6, 2016, the entire contents of which is incorporated herein for all purposes by this reference.

BACKGROUND OF THE INVENTION

Field of the Invention

The present invention generally relates to an image sensor and manufacturing method thereof. More particularly, the present invention relates to an image sensor in which the strength of adhesion between a photoconductive layer and a substrate is increased.

Description of the Related Art

Conventionally, X-rays for medical or industrial applications have typically used films and screens. In this case, the use of resources and time becomes inefficient due to problems related to the development and storage of the taken films.

Hence, digital-type image sensors are currently widely used. Such image sensors are classified into: indirect conversion-type image sensors and direct conversion-type image sensors.

In indirect conversion-type image sensors, X-rays are converted into visible light using a scintillator, after which the visible light is converted into an electrical signal. By comparison, in direct conversion-type image sensors, X-rays are directly converted into an electrical signal using a photoconductive layer. Direct conversion-type image sensors are suitable for use in high-resolution systems because there is no need for an additional scintillator and the spreading of light does not occur.

A photoconductive layer used for the direct conversion-type image sensors is formed on a complementary metal-oxide semiconductor (CMOS) substrate or a thin film transistor (TFT) substrate by performing vacuum evaporation on a surface thereof. A specific high process temperature is required for forming the photoconductive layer to perform vacuum evaporation. Herein, thermal stress occurs between the substrate and the photoconductive layer, and thus delamination or cracking of the photoconductive layer may occur since adhesion between the substrate and the photoconductive layer is degraded by the thermal stress.

Accordingly, reliability of image sensors is deteriorated since current leakage increases due to the delamination or the cracking of the photoconductive layer and thus charge collection efficiency is degraded.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present invention has been made keeping in mind the above problems occurring in the related art, and the present invention is to propose a way to increase the strength of adhesion between a photoconductive layer and a substrate and thus reliability of an image sensor is ensured.

In order to achieve the above object, according to one aspect of the present invention, there is provided an image sensor including: a plurality of first electrodes respectively formed within a plurality of pixel areas, the pixel areas being formed on a substrate; a protection layer formed on an upper surface of the substrate and including a plurality of contact holes respectively exposing the first electrodes of the pixel areas; a plurality of auxiliary electrodes respectively contacting with the first electrodes through the contact holes and extending to an upper surface of the protection layer of the pixel area; a photoconductive layer formed on both the first electrodes and on the auxiliary electrodes; and a second electrode formed on the photo conductive layer.

Herein, each of the auxiliary electrodes may extend to an edge part of an associated one of the pixel areas and be insulated from a neighboring pixel area.

Each of the auxiliary electrodes may be formed of a metal material to form a Schottky contact with the photoconductive layer.

According to another aspect, there is provided a method of manufacturing an image sensor, the method including: forming a protection layer on an upper surface of a substrate on which a plurality of first electrodes is formed in a plurality of pixel areas, the protection layer including a plurality of contact holes respectively exposing the first electrodes; forming a plurality of auxiliary electrodes that respectively contact with the first electrodes through the contact holes and extend to an upper surface of the protection layer; forming a photoconductive layer on the auxiliary electrodes; and forming a second electrode on the photoconductive layer.

Herein, each of the auxiliary electrodes may extend to an edge part of an associated one of the pixel areas and be insulated from a neighboring pixel area.

Each of the auxiliary electrodes is formed of a metal material to form a Schottky contact with the photoconductive layer.

According to an embodiment of the present invention, auxiliary electrodes formed of a metal material are formed between the photoconductive layer and the substrate.

Accordingly, thermal stress between the photoconductive layer and the substrate is reduced, so the strength of adhesion therebetween is increased and defects such as delamination or cracking of the photoconductive layer may be avoided. Thus, reliability of the image sensor is improved since current leakage of the photoconductive layer is reduced.

According to another embodiment of the present invention, auxiliary electrodes formed of a metal material are formed between the photoconductive layer and the substrate.

Therefore, according to the present invention, thermal stress between the photoconductive layer and the substrate is reduced, so the strength of adhesion of the photoconductive layer relative to the substrate is increased and defects such as delamination or cracking of the photoconductive layer may be avoided. Thus, charge collection efficiency of the image sensor is increased and current leakage of the photoconductive layer is reduced, thus improving operational reliability of the image sensor element.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings.

Figure 1:
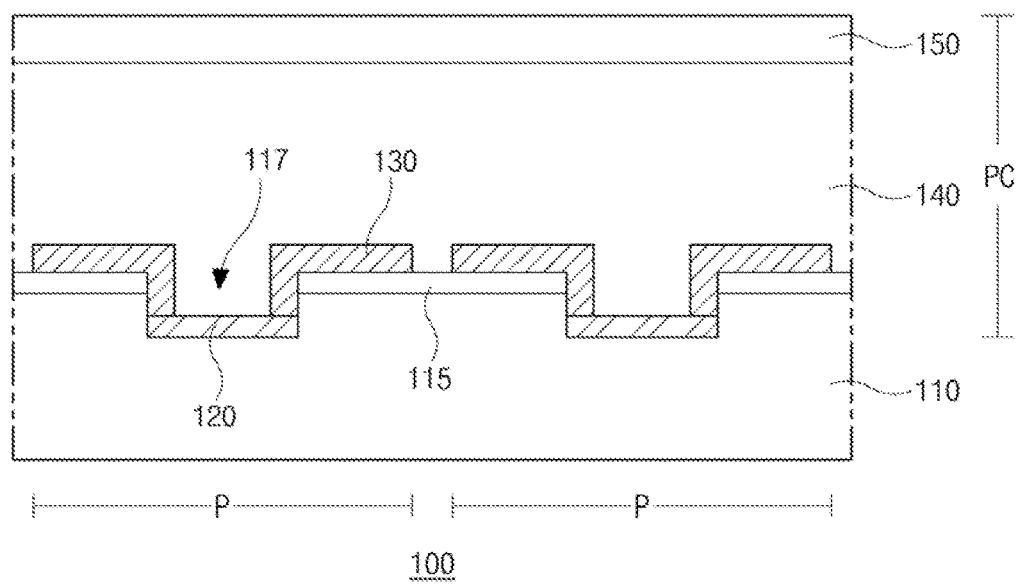
FIG. 1 is a cross-sectional view schematically showing an image sensor according to an embodiment of the present invention.

FIG. 1 is a cross-sectional view schematically showing an image sensor according to an embodiment of the present invention.

An image sensor 100 according to an embodiment of the present invention may be used in a variety of X-ray imaging devices having various shapes or end uses. For example, the X-ray imaging devices may include mammographic devices, CT devices, etc.

The image sensor 100 corresponds to a configuration in which X-rays that have passed through a target are detected and then converted into an electrical signal. The image sensor 100 has a rectangular shape when viewed from above, but it is not limited thereto.

In particular, the image sensor 100 according to the embodiment of the present invention is a direct conversion-type X-ray detector, in which incident X-rays are directly converted into an electrical signal.

Referring to FIG. 1, the image sensor 100 may include a plurality of pixel areas P, which are disposed in the form of a matrix including rows and columns.

Each of the plurality of pixel areas P may be configured with a photoelectric converter PC that converts X-rays into an electrical signal, and the photoelectric converters PC are formed on a substrate 110.

Herein, as the substrate 110 that is used for the image sensor 100, a CMOS substrate, a glass substrate, a graphite substrate, and a substrate on which an ITO is stacked on an aluminum oxide ($Al_2O_3$) base, etc. may be used. However, it is not limited thereto. In the embodiment of the present invention, for convenience of explanation, the CMOS substrate is used for the image sensor 100.

Contact holes 117 may be respectively and inwardly formed in the plurality of pixel area P. Each of the contact holes 117 may include a lower electrode 120 that is formed for each pixel area P. The lower electrode 120 is a first electrode constituting the photoelectric converter PC and refers to a pixel electrode, that is, a first electrode 120. The first electrode 120 functions to collect electric charges (in other words, electron or positive hole) that are generated from a photoconductive layer 140.

A protection layer 115 is formed on a surface of the substrate 110 on which the first electrodes 120 are formed. The protection layer 115 may be formed of an inorganic insulating material, for example, silicon oxide ($SiO_2$) or silicon nitride (SiNx).

The protection layer 115 is also formed to include contact holes 117 for each pixel area P as like the substrate 110, and the first electrodes 120 are respectively exposed through the contact holes 117.

A plurality of auxiliary electrodes 130 is formed on the protection layer 115 and is respectively formed on pixel areas P. In particular, each of the auxiliary electrodes 130 that is patterned for each pixel area P is configured to inwardly extend to the contact hole 117 so the auxiliary electrode 130 is contacted with an edge part of the first electrode 120.

In other words, each of the auxiliary electrodes 130 is contacted with the first electrode 120 at one side thereof and extends to an upper surface of the protection layer 115 of the pixel area P.

Herein, the auxiliary electrodes 130 formed on pixel areas P that are adjacent with each other extend to edge parts of the pixel areas P and are spaced apart by a certain interval at a boundary between the pixel areas P such that the auxiliary electrodes 130 are electrically insulated with each other.

Thus, the strength of adhesion between the photoconductive layer 140 that is directly formed on the surface of the substrate 110 and the substrate 110 may be increased by forming the auxiliary electrodes 130 that respectively extend from the first electrodes 120 to the edge parts of the pixel areas P.

Meanwhile, the protection layer 115 formed of silicon-nitride has poor strength of adhesion with the photoconductive layer 140, thus in the present embodiment, the auxiliary electrodes 130 that are formed of a metal material and have a relatively higher adhesive force than the protection layer 115 are provided between the protection layer 115 and the photoconductive layer 140. Accordingly, the strength of adhesion between the photoconductive layer 140 and the substrate 110 may be increased. It is preferable to form the auxiliary electrodes 130 by using a metal material having a small difference in thermal expansion coefficient from the photoconductive layer 140.

In addition, it is preferable to form the auxiliary electrodes 130 by using a metal material that forms a Schottky contact with the photoconductive layer 140 that is formed on an upper part of the substrate 110.

In this regards, the auxiliary electrodes 130 are respectively contacted with the first electrodes 120 and may function as pixel electrodes that collect charges generated from electrodes of the photoelectric converters PC, in other words, charges generated from the photoconductive layer 140, as the first electrodes 120 do. Herein, charge collection efficiency is maximized since charges are actually collected through the entire area of the pixel area P.

Therefore, it is preferable to form the auxiliary electrodes 130 with a metal material having a work function capable of forming the Schottky contact with the photoconductive layer 140 such that the auxiliary electrodes 130 collect charges as the first electrodes 120 do.

As the metal material that may be used as the material of the auxiliary electrodes 130 having the above-mentioned function, Ti, Mo, Ru, etc. that have a small difference in thermal expansion coefficient from the photoconductive layer 140 and have a low work function may be used when the first electrode 120 is formed of a material that has a lower work function than the photoconductive layer 140 (in other words, when the first electrode 120 is a cathode), but it is not limited thereto. Alternatively, when the first electrode 120 is formed of a material that has higher work function than the photoconductive layer 140 (in other words, when the first electrode 120 is an anode), Al, Au, etc. that has a small difference in thermal expansion coefficient from the photoconductive layer 140 and has a high work function may be used, but it is not limited thereto.

Herein, the first electrode 120 and the auxiliary electrode 130 may be formed of the same material or may be formed of different materials.

As described above, in the present embodiment, a contacting area between the photoconductive layer 140 and the auxiliary electrodes 130 within the pixel areas P may be maximized by forming the auxiliary electrodes 130 to be contacted with the first electrodes 120 and to extend to the edge part of the pixel areas P. Thus, the strength of adhesion between the photoconductive layer 140 and the substrate 110 may also be maximized. In addition, areas of the lower electrodes collecting charges and respectively configured with the first electrodes 120 and the auxiliary electrodes 130 may be actually maximized.

Therefore, defects such as delamination or cracking of the photoconductive layer 140 may be minimized and thus current leakage may also be minimized. Thus, reliability of the image sensor may be improved by maximizing charge collection efficiency.

The photoconductive layer 140 is formed on the upper part of the substrate 110 on which the auxiliary electrodes 130 are formed. The photoconductive layer 140 is in contact with both the first electrodes 120 and the auxiliary electrodes within the contact holes 117 and is also in contact with the auxiliary electrodes 130 formed on the protection layer 115, at areas outside the contact holes 117.

The photoconductive layer 140 generates pairs of electron-holes when X-rays are incident. A material that has properties of good charge transfer characteristics, a high absorption coefficient, a low dark current, and a generation of low electron-hole pair energy may be used as the photoconductive layer 140. For example, at least one of photoconductive materials such as CdTe, CdZnTe, PbO, $PbI_2$, $HgI_2$, GaAs, Se, TlBr, and $BiI_3$ may be used.

An upper electrode 150 may actually be formed on the photoconductive layer 140 along the upper the surface of the substrate 110. A bias voltage is applied to the upper electrode 150. The upper electrode 150 corresponds to a second electrode of the photoelectric converter PC and refers to a second electrode 150. Herein, the second electrode 150 is an anode when the first electrode 120 is a cathode, and vice-versa.

Hereinafter, a method of forming the auxiliary electrode 130 according to an embodiment of the present invention will be described with reference to FIGS. 2A to 2E.

Figure 2A:
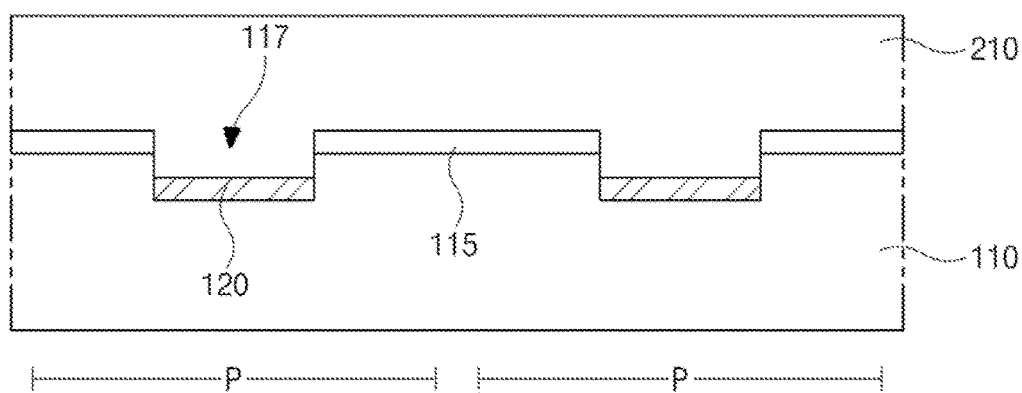
FIGS. 2A to 2E are cross-sectional views showing a method of forming an auxiliary electrode according to an embodiment of the present invention.

First, referring to FIG. 2A, a photoresist 210 is coated on the surface of the substrate 110 on which first electrodes 120 and a protection layer 115 are formed. Herein, for convenience of explanation, a p-type photoresist in which a part thereof that receives light is removed is used.

Figure 2B:
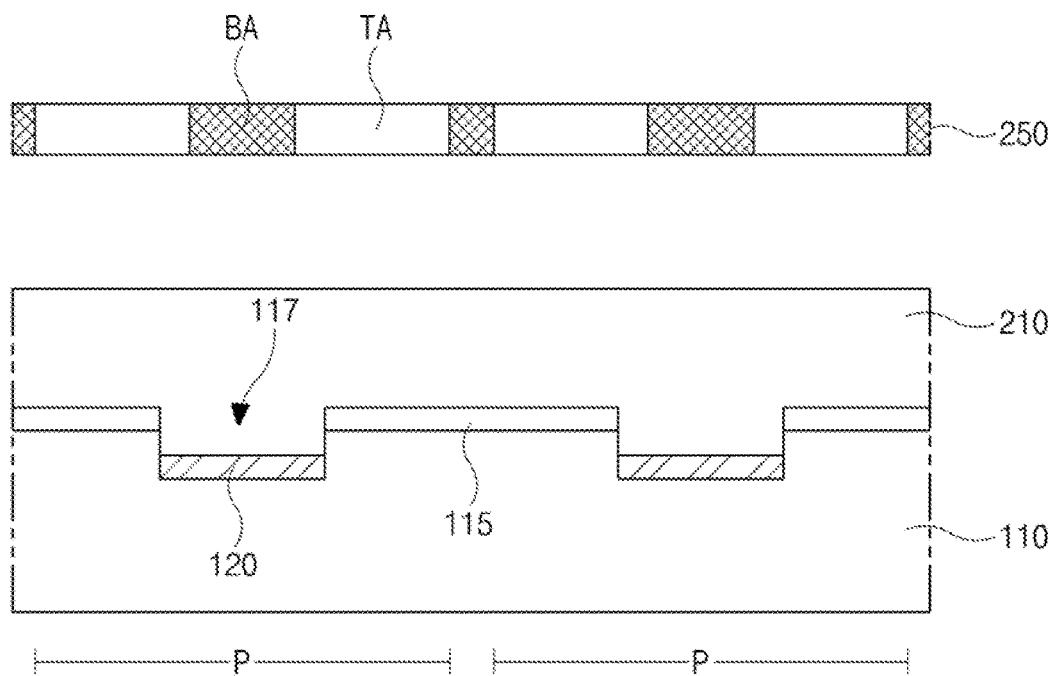

Then, referring to FIG. 2B, a photo mask 250 is disposed above the photoresist 210. The photo mask 250 includes transmission areas TA that pass light and blocking areas BA that block the light.

Herein, the transmission areas TA are disposed at a position corresponding to areas of the auxiliary electrodes 130, and the blocking areas BA are disposed at the remaining areas except for the transmission areas TA.

After disposing the photo mask 250, an exposure process is performed on the photo mask 250.

Figure 2C:
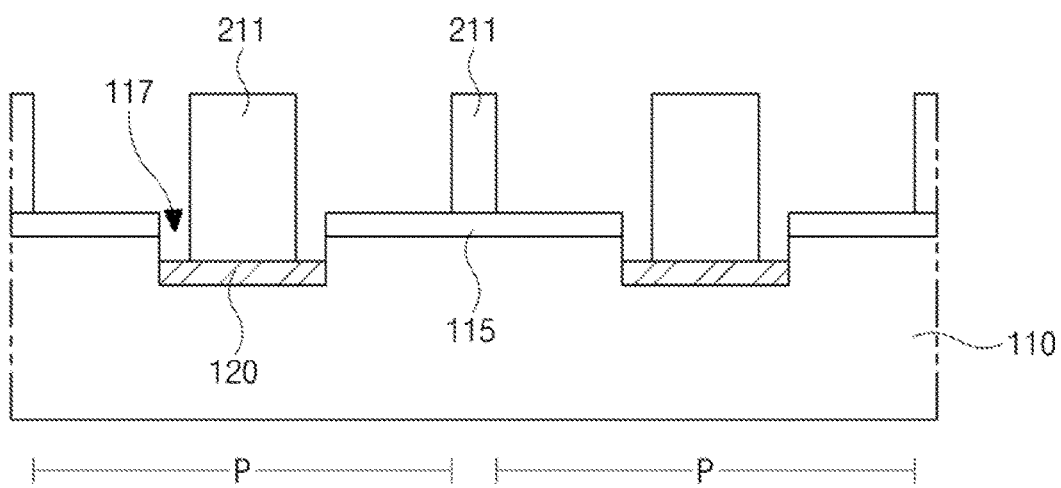

Then, referring to FIG. 2C, a development process is performed on the photoresist 210 in which an exposure process is performed. Accordingly, the photoresist of areas corresponding to the transmission areas TA is removed and the photoresist of areas corresponding to the blocking areas BA is remained by the development process and thus a photoresist pattern 211 is formed.

Herein, for example, the photoresist pattern 211 is formed on a center part of the first electrode 120 within the contact hole 117 of each pixel area P and is formed in a gap between the pixel areas P that are adjacent with each other.

Figure 2D:
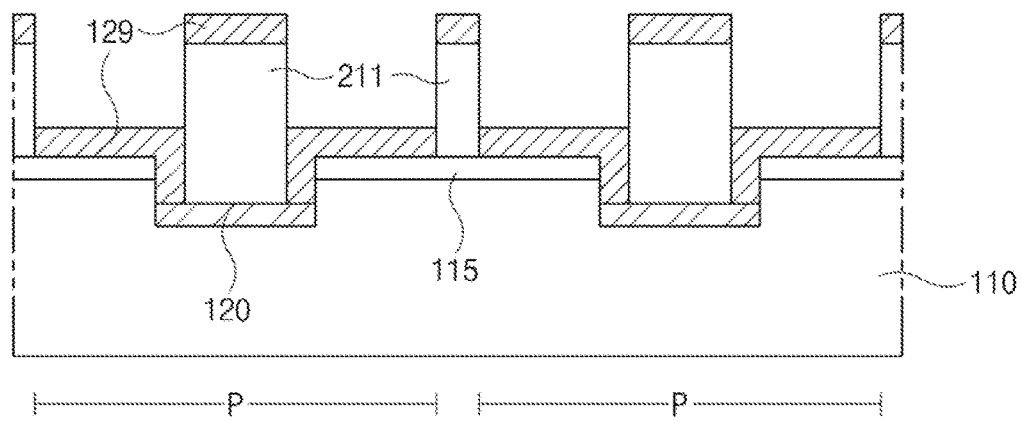

Then, referring to FIG. 2D, a metal material is deposited on the substrate 110 on which the photoresist pattern 211 is formed. Accordingly, a metal layer 129 is formed on an upper surface of the photoresist pattern 211 and on upper parts of the substrate 110 that are exposed within the photoresist pattern 211. Herein, the metal layer 129 and the first electrode 120 may be formed of the same material or of different materials.

Figure 2E:
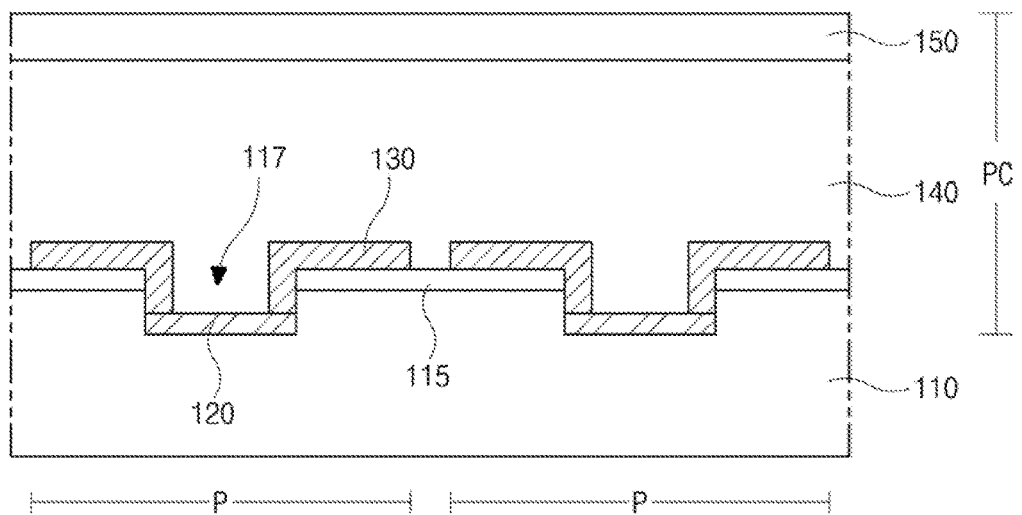

Then, referring to FIG. 2E, a lift-off process is performed on the photoresist pattern 211. Accordingly, the photoresist pattern 211 and the metal layer 129 formed thereon are removed, and the metal layer 129 formed on the upper parts of the substrate 110 and exposed within the photoresist pattern 211 is remained on the substrate 110. The remaining metal layer 129 formed on the upper parts of the substrate 110 and exposed within the photoresist pattern 211 corresponds to the auxiliary electrodes 130.

Then, a cleaning process is performed on the substrate 110 on which the auxiliary electrodes 130 are formed.

The auxiliary electrodes 130 according to the first embodiment of the present invention may be formed by using the method as described above.

After forming the auxiliary electrodes 130 as described above, the photoconductive layer 140 and the second electrode 150 are formed on the substrate on which the auxiliary electrodes 130 are formed.

As described above, according to the embodiment of the present invention, the auxiliary electrodes are formed to respectively contact with the first electrodes and extend to the edge part of the pixel areas while being disposed between the substrate and the photoconductive layer.

Accordingly, a contacting area between the auxiliary electrode and the photoconductive layer within the substrate becomes larger and thus the strength of adhesion between the photoconductive layer and the substrate is increased. In addition, areas of lower electrodes that collect charges and are respectively configured with the first electrodes 120 and the auxiliary electrode 130s may be actually maximized.

Therefore, defects such as delamination or cracking of the photoconductive layer may be minimized and thus current leakage may also be minimized. Thus, reliability of the image sensor may be improved by maximizing charge collection efficiency.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. An image sensor comprising:
   a plurality of first electrodes respectively formed within a plurality of pixel areas, the pixel areas being formed on a substrate;
   a protection layer formed on an upper surface of the substrate and including a plurality of contact holes respectively exposing the first electrodes of the pixel areas;
   a plurality of auxiliary electrodes respectively contacting with the first electrodes through the contact holes and extending to an upper surface of the protection layer of the pixel area;
   a photoconductive layer formed on and directly contacting both of the first electrodes and the auxiliary electrodes; and
   a second electrode formed on the photo conductive layer.
2. The image sensor of claim 1, wherein each of the auxiliary electrodes extends to an edge part of an associated one of the pixel areas and is insulated from a neighboring pixel area.

3. The image sensor of claim 1, wherein each of the auxiliary electrodes is formed of a metal material to form a Schottky contact with the photoconductive layer.

* * * * *